United States Patent [19]

Sablev et al.

[11] Patent Number: 5,451,308
[45] Date of Patent: Sep. 19, 1995

[54] ELECTRIC ARC METAL EVAPORATOR

[75] Inventors: Leonid P. Sablev, Kharkov, Ukraine, 310108; Anatoly A. Andreev, Ukraine, Sergei N. Crigoriev, Moscow

[73] Assignee: NOVATECH, Moscow Russian Federation

[21] Appl. No.: 146,044

[22] PCT Filed: Apr. 28, 1992

[86] PCT No.: PCT/RU92/00095
§ 371 Date: Dec. 13, 1993
§ 102(e) Date: Dec. 13, 1993

[87] PCT Pub. No.: WO92/19789
PCT Pub. Date: Dec. 11, 1992

[30] Foreign Application Priority Data

Apr. 29, 1991 [SU] U.S.S.R. ................. 4931910
Apr. 29, 1991 [SU] U.S.S.R. ................. 4948577
Sep. 19, 1991 [SU] U.S.S.R. ................. 5002414

[51] Int. Cl.6 ............................................. C23C 14/32
[52] U.S. Cl. ................... 204/298.41; 204/192.38
[58] Field of Search ................. 204/192.38, 298.41

[56] References Cited

U.S. PATENT DOCUMENTS 3,793,179  2/1974  Sablev et al. .............. 204/298.41
4,734,178  3/1988  Gavrilov et al. ............ 204/192.38
5,037,522  8/1991  Vergason .................... 204/298.41
5,269,898 12/1993  Welty ........................ 204/298.41

FOREIGN PATENT DOCUMENTS 461163  2/1975  U.S.S.R. ................... 204/298.41

Primary Examiner—Aaron Weisstuch
Attorney, Agent, or Firm—Knobbe, Martens, Olson & Bear

[57] ABSTRACT

An electric arc metal evaporator has a cathode (2) extending along its longitudinal axis which is made of an evaporating material and has an evaporation surface extending along its longitudinal axis, and power supply leads (7,8) connected to opposite ends (5,6) of cathode (2) and connected to control switches (10) and (11) which are connected through individual activating members (12,13) to a control unit (14) and a direct current power supply (15) which is also is connected to an anode, and a unit for determining the current position of the cathode spot (16) on the evaporation surface (3) of cathode (2) which is connected to a control unit (14.) The cathode (2) itself can be used as a current position detector (17) and its power supply leads (7,8) serve as the detector (17) power supply leads.

7 Claims, 3 Drawing Sheets

ELECTRIC ARC METAL EVAPORATOR

FIELD OF THE INVENTION

The field of this invention is electric arc metal evaporators.

PRIOR ART

An electric arc metal evaporator having a cathode, which is made of evaporating metal and which has an evaporation surface, and a direct current power supply connected to cathode and anode is known (U.S. Pat. No. 3,793,179).

In the above mentioned evaporator, the surface of a substrate is coated with material evaporated by the action of a cathode spot of an electric vacuum arc which moves chaotically over a cathode surface. Active evaporation of cathode material from its surface and deposition of evaporated metal on substrates, which are placed opposite to cathode evaporation surface, occurs due to the high concentration of energy in the cathode spot of the electric arc.

When long objects are processed it is necessary to use several evaporators placed along the length of the objets. This results in difficulties when this type of evaporator is used.

Another known electric arc metal evaporator (SU, A, 461,163) has a cathode, which is extended along its longitudinal axis and in which the evaporation surface is placed along its longitudinal axis, and connecting leads, which are placed on the opposite sides of the cathode and are connected to controllable switches, which are connected to each other through separate turn-on members. These members have a control unit and are connected to a direct current power supply, which is also connected to the anode. This device also has a unit for determination of the cathode spot position on the cathode evaporation surface. This unit is connected to a control unit.

The unit for determination of the cathode spot position on the cathode evaporation surface is constructed using detectors of the final position of the cathode spot. The cathode spot movement under the influence of the magnetic field of the current passing through cathode moves always in direction of the connecting wire. When the cathode spot reaches the end the cathode, the unit for determination of cathode spot position sets the level of an electric signal which enters the control unit. The control unit switches on a control switch placed near the cathode end opposite the cathode spot and simultaneous switching-off of another switch. Because the cathode spot moves over the cathode surface with uniform speed in the space between the detectors of the final position of the cathode spot, the uniformity of movement does not allow control of the time of plasma flow on some parts of substrate to be coated. This results in coating thicknesses which differ at the substrate ends from its central zone.

SUMMARY OF THE INVENTION

The described invention is based on the object of making a metal evaporator in which the unit for determination of cathode spot position on the cathode evaporation surface allows control of cathode spot movement according to a given program. This results in uniform coating over the whole surface of the substrate.

The object is accomplished by construction of a unit for determination of the cathode spot position on a cathode evaporation surface which detects the current position of the cathode spot on the cathode evaporation surface. The device also has a cathode, which is extended along its longitudinal axis, made of evaporating material and having its evaporation surface placed along its longitudinal axis, and connecting lead wires which are placed on the opposite sides of the cathode and connected to control switches which are connected to each other and to a direct current power supply. The direct current power supply is also connected to an anode. A unit for determination of the cathode spot position on the cathode evaporation surface is connected to the control unit.

The cathode can serve as detector of the current position of the cathode spot on the cathode evaporation surface. The connecting leads of the cathode can serve as connecting leads of the detector.

The detector of the current position of the cathode spot is shaped as an extended conductor which is made of high resistivity, which length is about half that of the cathode, which has at its ends two connecting leads connected to the input of the control unit, and which is placed in close proximity to the cathode evaporation surface.

The control unit has a voltage converter, and a comparison unit, the output of which is connected to the voltage converter and to separate turn-on members of the control switches. A first input of the comparison unit is connected to the power supply leads of the cathode which also serves as detector of the current position of the cathode spot on the cathode evaporation surface. The control unit also has programming unit which output is connected to second input of comparison unit.

The cathode, which also serves as a detector of the current position of the cathode spot on the cathode evaporation surface, is connected to a first input of the comparison unit through the voltage converter, and the second input of the comparison unit is directly connected to the output of the programming unit.

The power supply leads of the cathode, which also serves as a detector of the current position of the cathode spot on cathode evaporation surface, are directly connected to the first input of the comparison unit, and the second input of the comparison unit is connected to the output of the programming unit through the voltage converter.

The control unit has a comparison unit, the first input of which is connected to the power supply leads of the extended conductor of the detector of the current position of the cathode spot on the cathode evaporation surface.

The output of the control unit is connected to separate turn-on members of control switches and the control unit has a programming unit the output of which is connected to the second input of the comparison unit.

Such construction of the evaporator provides uniform coating of the whole surface of the substrate.

BRIEF DESCRIPTION OF THE DRAWINGS

The following text explains the invention by means of description of specific embodiments and by the attached drawings where.

DETAILED DESCRIPTION OF THE INVENTION

Figure 1:
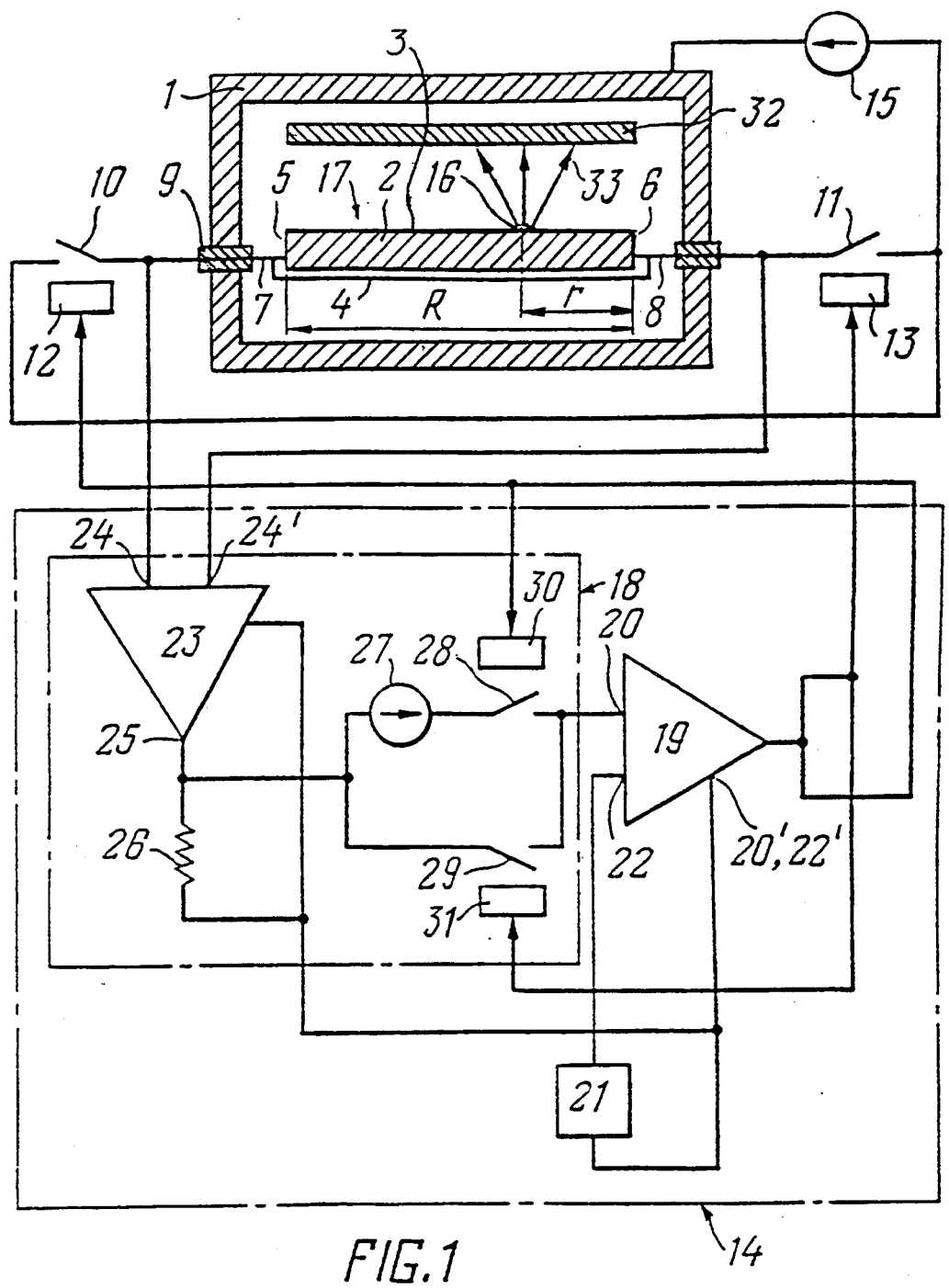
FIG. 1 is a schematic diagram of the electric arc metal evaporator wherein the vacuum chamber is shown in longitudinal section.

The electric arc metal evaporator according to the invention will now be described using an example of an evaporator for electric arc hard-coating in vacuum.

The electric arc metal evaporator according to the invention has a vacuum chamber 1 (FIG. 1) which also serves as an anode. Cathode 2, which is made of evaporating material, e.g. titanium, and has its evaporation surface extended along its longitudinal axis, is mounted in vacuum chamber 1. The evaporation surface 3 of cathode 2 is limited by shield 4 insulated from the cathode 2. Cathode 2 has on its opposite end faces 5 and 6 respective power supply leads 7 and 8 extending through the chamber walls through insulators 9 which are mounted in the walls of chamber 1.

The power supply leads 7 and 8 are connected to control switches 10 and 11 which are connected through separate switch activating members 12 and 13 to control unit 14 and to the negative terminal of direct current power supply 15, the positive terminal of which is connected to vacuum chamber 1 which serves as the anode.

The electric arc evaporator according to the invention also has a device for determination of cathode spot position 16 on the evaporation surface 3 of cathode 2. Said device 16 is connected to control unit 14.

The described modification uses cathode 2 as a detector 17 of the cathode spot current position 16 on the evaporation surface 3 of cathode 2. Cathode power supply leads 7 and 8 serve as power supply leads of detector 17.

Control unit 14 has voltage converter 18 and comparison unit 19, the output of which is connected to voltage converter 18 and separate members 12 and 13 for activating control switches 10 and 11. First input 20, 20' of comparison unit 19 is connected to power supply leads 7 and 8 of cathode 2, which also serves as detector 17 of the current position of the cathode spot 16 on the evaporation surface 3 of cathode 2. The control unit 14 also has a programming device 21, the output of which is connected to second input 22, 22' of comparison unit 19.

The electric arc evaporator according to the invention has an electrical connection of first input 20, 20' of comparison unit 19 through voltage converter 18 to power supply leads 7, 8 of cathode 2, which also serves as detector 17. The output of programming device 21 is directly connected to the second input 22, 22' of comparison unit 19. In this case, voltage converter 18 has operational amplifier 23 the input 24, 24' of which is connected to power supply leads 7 and 8 of cathode 2, which also serves as detector 17. Operational amplifier output 25 is connected to load resistor 26, switch 29, and power supply 27, which is connected to switch 28. Switches 28 and 29 are connected to first input 20, 20' of comparison unit 19 and have respective activating members 30 and 31 which are connected to the output of comparison unit 19.

Operational amplifier 23, loading resistor 26, programming unit 21 and comparison unit 19 are connected to a common connection point.

The design of programming unit 21 is known to those skilled in the art. This unit executes a program that determines the generated control voltage.

Substrate 32 is placed in chamber 1 opposite the evaporation surface 3 of cathode 2. Metal plasma flow 33 which is generated by cathode spot 16 on evaporation surface 3 of cathode 2 is deposited on substrate 32.

The necessity for cleaning the detector 17 of metal particles evaporated from cathode 2 can be avoided in the above described electric arc evaporator according to the invention.

Figure 2:
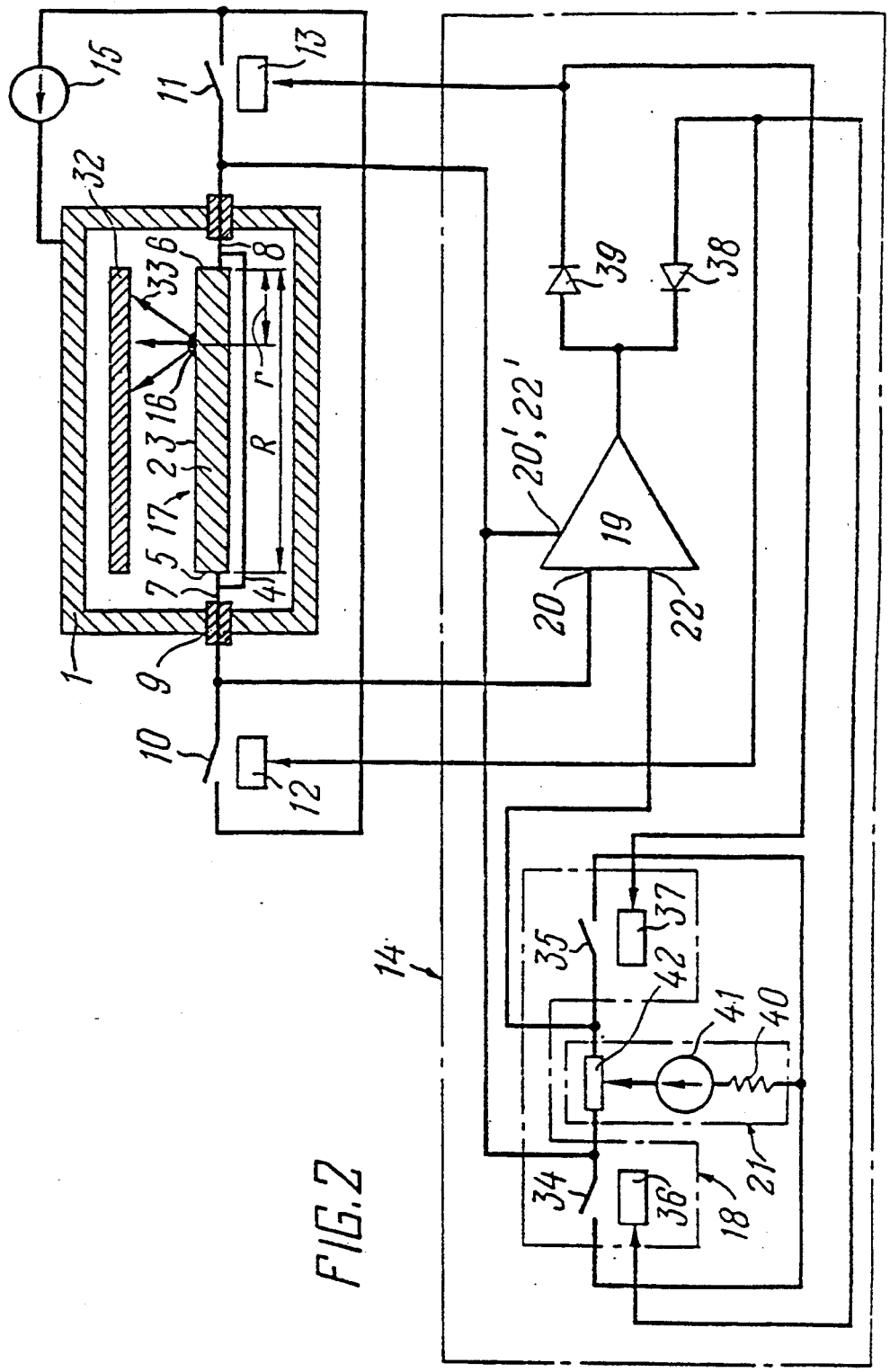
FIG. 2 is a schematic diagram of a modification of the evaporator construction, wherein the vacuum chamber is shown in longitudinal section.

The embodiment of electric arc evaporator according to the invention that is represented in FIG. 2 is analogous to that represented in FIG. 1.

The difference is that electric connection of first input 20, 20' of comparison unit 19 to power supply leads 7 and 8 of cathode 2, which serves as detector 17, is direct. Electrical connection of the output of programming unit 21 to the second input 22, 22' of comparison unit 19 goes through the voltage converter 18.

Voltage converter 18 has switches 34 and 35 connected to the output of programming unit 21 and second input 22, 22' of comparison unit 19. Switches 34 and 35 have respective activating members 36, 37 which are connected through diodes 38 and 39 to the output of comparison unit 19. Activating members 12 and 13 which turn on control switches 10 and 11 are connected to the output of comparison unit 19 through the same diodes 38 and 39.

Programming device 21 has resistor 40, control voltage supply 41, and potentiometer 42 connected in series. The terminals of potentiometer 42 provide the output of unit 21.

Switches 34 and 35 are connected to each other and to resistor 40 of programming unit 21.

Figure 3:
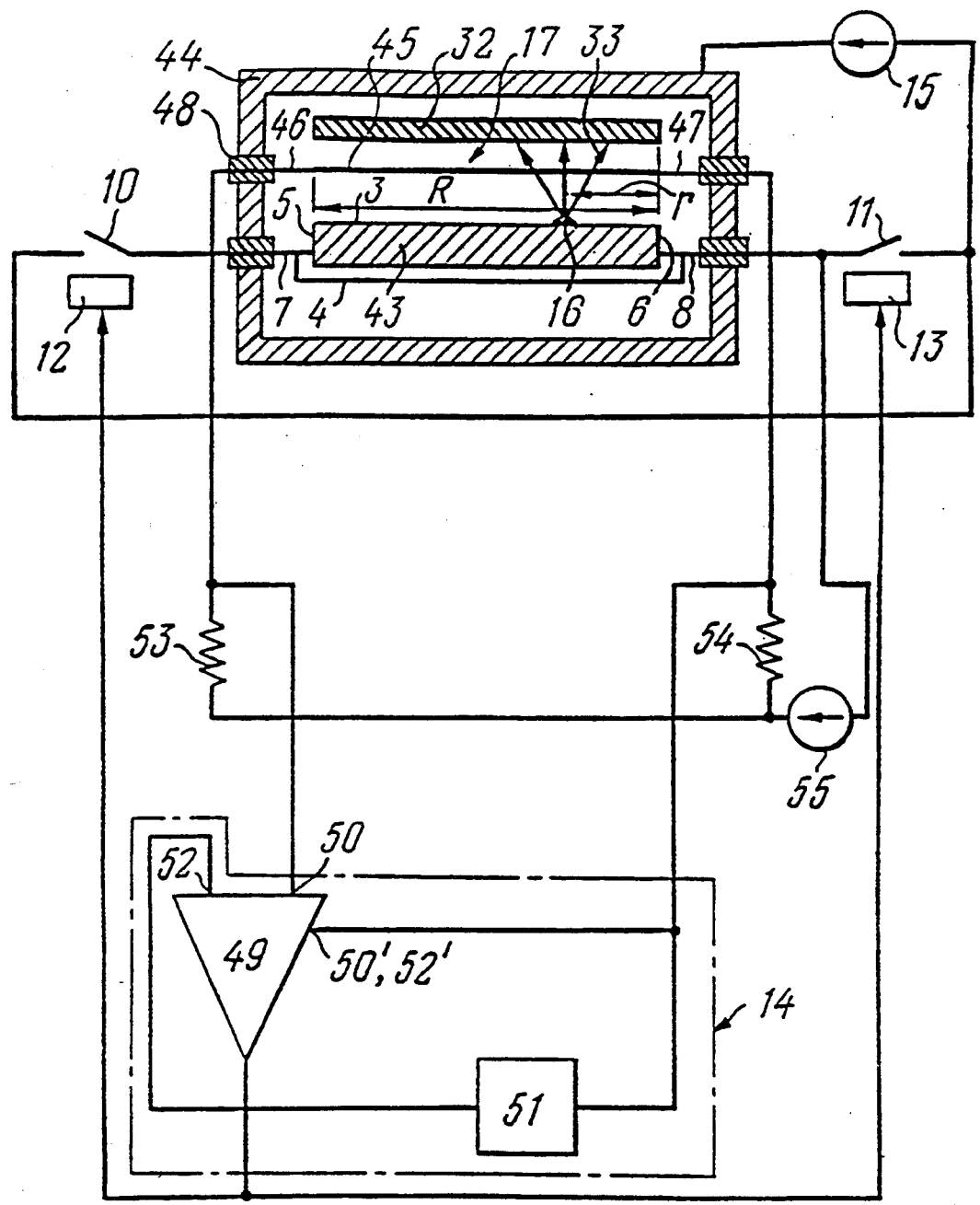
FIG. 3 is a schematic diagram of yet another modification of the evaporator construction, wherein the vacuum chamber is shown in longitudinal section.

The embodiment of the electric arc evaporator according to the invention represented in FIG. 3 is analogous to the embodiment represented on FIG. 1.

The difference is that detector 17 (FIG. 3) of the cathode spot current position 16 on evaporation surface 3 of cathode 43 is made as an extended conductor 45 which is placed inside vacuum chamber 44, is made of a material with high resistivity, e.g. nichrome alloy, and has two power supply leads 46 and 47 connected to its ends. The length of conductor 45 equals approximately the length of cathode 43. Conductor 45 is placed in parallel to evaporation surface 3 of cathode 42 in close proximity to it. Power supply leads 46 and 47 are taken out of the chamber through insulators 48, which are mounted in the walls of chamber 44, and are connected to the input of control unit 14.

The control unit 14 has a comparison unit 49, of which the first input 50, 50' is connected to power supply leads 46 and 47 of extended conductor 45 of detector 17. The output of comparison unit 49 is connected to activating members 12 and 13 for turning on control switches 10 and 11. In addition, control unit 14 has a programming unit 51, the output of which is connected to second input 52, 52' of comparison unit 49.

Power supply leads 46 and 47 of extended conductor 45 are connected to current stabilizers in the form of resistors 53 and 54. Resistors 53 and 54 are connected to each other and to the positive terminal of direct current power supply 55, the negative terminal of which is connected to power supply lead 8 of cathode 2.

The programming unit 51 is the same unit as in the evaporator embodiment according to FIG. 2 and has the same functional purpose.

The operating principle of electric arc metal evaporator according to invention is the following.

Vacuum chamber 1 (FIG. 1) is pumped down by an air pumping system (which is not shown in the drawing) to a pressure determined by the technological purpose. The range of working pressure is limited on the upper side by approximately 10 Pa and is practically unlimited on the lower side because the working medium where current is transferred consists of by-products of erosion of cathode 2 which are ionized by arc discharge. When the given working pressure is achieved anode (vacuum chamber 1) and cathode 2 are supplied with direct current from power supply 15 and cathode spot 16 is initiated on evaporation surface 3 of cathode 2 by means of an ignition device (which is not shown in the drawing because it is well-known and is not the subject of this invention). Cathode spot 16 generates plasma flow 33 which extends mainly in the direction which is normal to evaporation surface 3 of cathode 2.

It is well-known that, for cathodes having an extended shape and power supply leads on the opposite sides of cathode, the cathode spot of the arc discharge always extends towards the turned-on power supply lead. Arc discharge current passing through extended cathode 2 generates a magnetic field the direction of which forces cathode spot 16 to move in the direction of turned-on power supply lead 7 or 8.

Reciprocation of the cathode spot 16 on the evaporation surface 3 of cathode 2 is accomplished by alternate turning on of power supply leads 7 and 8. Alternation of power supply leads is accomplished by control switches 10 and 11. When switch 11 is turned on, cathode spot 16 moves towards power supply lead 8. The voltage at the terminals of cathode 2 is $$U_1 = ir,$$

where i is discharge current, and r is the resistance of the cathode part between cathode spot 16 and end 6 of cathode 2. This voltage is supplied to input 24, 24' of operational amplifier 23 of voltage converter 18. Voltage $U_2 = k \cdot U_1$ is generated on resistor 26, where $U_2$ is the voltage at output of converter 18 and k is the scaling ratio.

This voltage supplies first input 20, 20' of comparison unit 19 through closed switch 29. Second input 22, 22' of comparison unit 19 receives voltage $U_3$ from programming unit 21. Voltage $U_3$ determines the position of cathode spot 16 on cathode 2. If $k \cdot U_1 = U_3 > 0$ then switch 11 is closed. Cathode spot 16 moves along the cathode towards power supply lead 8 until switch 10 turns on and switch 11 turns off.

When switch 10 is turned on the voltage at the terminal of cathode 2 rises to a value $-(U-U_1) = -i \cdot (R-r)$, where R is the resistance of cathode 2, and switch 29 is turned off and switch 28 is turned on at this time. Voltage converter 18 generates voltage $U_2 = k \cdot (U_1-U) + U_4$, where U is the maximum voltage measured at detector 17 which is also cathode 2. $U_4$ is the voltage of power supply 27, which is adjusted to be equal to U.

So, $U_2 = k \cdot U_1$, i.e. input 20, 20' of comparison member 19 receives the same voltage at the moment of activation of switches 28 and 29.

The modification of the electric arc metal evaporator according to FIG. 2 operates analogous to the evaporator according to FIG. 1.

The difference is that the signal from cathode 2 which is also the detector of the current position of the cathode spot 16 enters input 20, 20' of comparison unit 19 directly, and the signal from the programming unit 21 enters the input 22, 22' of comparison unit 19 through voltage converter 18.

If an error signal enters inputs 20, 20' and 22, 22' of comparison unit 19 as the result of chaotic movement of cathode spot 16 over evaporation surface of cathode 2, then a signal through diode 38 or 39 enters activating members 12 and 13, depending on the polarity of the input signal. When cathode spot 16 moves, the switch corresponding to the direction of displacement of cathode spot 16 is opened. This results in an increasing value of the signal picked up from power supply leads 7, 8 of cathode 2 from U to $-(U-U_1)$. It is necessary for normal operation of evaporator that the voltage determined by programming unit 21 changes from $U_3$ to $-(U-U_3)$ when switches 10 and 11 are switched. Voltage converter 18 serves this purpose.

Voltage converter 18 operates as follows.

Voltage from power supply 41 of programming unit 21 through resistor 40 and controlled switches 34 and 35 having activating members 36 and 37 supplies potentiometer 42. When switch 34 is closed then input 22, 22' of comparison unit 19 is supplied by voltage $U_3$. When switch 35 is closed then input 22, 22' is supplied by voltage $(U-U_3)$, i.e. when the signal generated by detector 17 of current position of cathode spot 16 increases, voltage at the output of voltage converter 18 also increases.

Change of position of the cathode spot 16 on cathode 2 is carried out by displacement of the slider of potentiometer 42.

The modification of the electric arc metal evaporator according to FIG. 3 operates analogous to the evaporator according to FIG. 1.

The difference is that current stabilizers in the form of resistors 53, 54 form a bridge in which a diagonally opposite pair of junctions is connected to input 50, 50' of comparison unit 49. The resistance of each resistor 53 and 54 is such that it is an order of magnitude higher than resistance R of conductor 45 of detector 17. When this condition is satisfied, the voltage $U_5$ at the diagonally opposite pair of junctions of the bridge equals to $U_5 = i/2 \cdot (r-R/2)$.

The previous expression signifies that the voltage at the diagonally opposite pair of junctions of the bridge determines the position of cathode spot 16 on evaporation surface 3 of cathode 2 unambiguously and first input 50, 50' of comparison unit 49 receives the signal directly generated at conductor 45 of detector 17. At the same time, second input 52, 52' of comparison unit 49 receives a signal from programming unit 51 and comparison unit 49 generates at its output an amplified signal, the level of which is proportional to the voltage difference at outputs 50, 50' and 52, 52'. When the potentials at inputs 50, 50' and 52, 52' of comparison unit 49 are equal the signal at its output is zero and both switches 10 and 11 close. When both switches 10 and 11 are closed two directions of motion of cathode spot 16 are equivalent (cathode spot 16 moves chaotically). When the position of cathode spot 16 changes, the potential at conductor 45 also changes and non-equal signals enter inputs 50, 50' and 52, 52' of comparison unit 49. This results in an increased potential at the output that opens the switch corresponding to the direction of increasing unbalance signal. Then cathode spot 16 begins movement in the direction corresponding to decreasing the unbalance signal.

So, comparison unit 49 and control switches 10 and 11, which are affected by it, constantly keep the position of cathode spot on cathode 2 so that the voltage difference is zero. When the signal at the output of programming unit 51 changes, then a voltage difference appears at inputs 50, 50' and 52, 52' of comparison unit 49 and the control unit 14 operates so that cathode spot 16 moves to a new position on cathode 2 to restore voltage balance.

The cathode spot is moved in a given direction according to a given program by changing the voltage at the output of programming unit 51.

Thus, according to the invention, an electric arc metal evaporator, which is used in particular for electric arc hard-coating in vacuum, provides a possibility of different thickness profiles of coatings.

INDUSTRIAL APPLICABILITY

The electric arc metal evaporator can be used for deposition hardening and decorative coatings on extended surfaces of such products as long shafts, tubes, tools, gears, hobbing cutters and also for all kinds of vacuum-plasma product processing including thermochemical and thermal processing and surface cleaning of products.

We claim:

1. An electric arc metal evaporator having a cathode defining a longitudinal axis, made of an evaporable material and having an evaporation surface along said longitudinal axis, and power supply leads connected to opposite ends of the cathode and connected to control switches which are connected through separate activating members to a control unit and to a direct current power supply which is also connected to an anode, and a circuit for determining the current position of a cathode spot anywhere on the evaporation surface of the cathode, which circuit is connected to the control unit, said circuit for determining the current position of the cathode spot on the evaporation surface of the cathode comprising a detector of current position of the cathode spot anywhere on the evaporation surface of the cathode.

2. An electric arc evaporator as claimed in claim 1, wherein the cathode itself serves as the detector of current position of the cathode spot on the evaporation surface of the cathode and the power supply leads of the cathode are power supply leads of the detector.

3. An electric arc evaporator as claimed in claim 1, wherein the detector of current position of the cathode spot on the evaporation surface of the cathode comprises an elongated conductor which is made of high resistivity material and which has a length approximately equal to the length of the cathode the conductor having at its ends two power supply leads which are connected to the input of the control unit and being positioned in a close proximity to the evaporation surface of the cathode.

4. An electric arc evaporator as in claim 3, wherein the control unit comprises a comparison unit having a first input connected to power supply leads of the elongated conductor of the detector of the current position of the cathode spot on the evaporation surface of the cathode, the output of the comparison unit being connected to individual members for activating the control switches and wherein the control unit also comprises a programming unit having an output connected to a second input of the comparison unit.

5. An electric arc evaporator as claimed in claim 1, wherein the control unit comprises a voltage converter, a comparison unit having an output connected to the voltage converter and individual members for actuating said control switches a first input connected to power supply leads of the cathode which also serves as the detector of the current position of the cathode spot on the evaporation surface of the cathode and a programming unit having an output connected to the second input of the comparison unit.

6. An electric arc evaporator as in claim 5, wherein the electric coupling of the first input of the comparison unit to the power supply leads of the cathode which serves as the detector of the current position of the cathode spot on the evaporation surface of the cathode is effected through the voltage converter and the second input of the comparison unit is directly electrically coupled to the output of the programming unit.

7. An electric arc evaporator as in claim 5, wherein the first input of the comparison unit is directly electrically coupled to the power supply leads of the cathode which serves as the detector of the current position of the cathode spot on the evaporation surface of the cathode and the second input of the comparison unit is electrically coupled to the output of the programming unit through the voltage converter.

* * * * *

UNITED STATES PATENT AND TRADEMARK OFFICE
CERTIFICATE OF CORRECTION

PATENT NO. : 5,451,308
DATED : September 19, 1995
INVENTOR(S) : Sablev, Andreev and Grigoriev It is certified that error appears in the above-indentified patent and that said Letters Patent is hereby corrected as shown below:

On the cover page, Item [75] Inventors: line 3, please correct the spelling of inventor's name from "Crigoriev" to -- Grigoriev--.

Signed and Sealed this

Thirtieth Day of April, 1996

Attest:

BRUCE LEHMAN

Attesting Officer   Commissioner of Patents and Trademarks